United States Patent [19]

Furukawa et al.

[11] Patent Number: 4,649,860
[45] Date of Patent: Mar. 17, 1987

[54] VACUUM EVAPORATION COATING EQUIPMENT

[75] Inventors: Heisaburo Furukawa; Kanji Wake; Yoshio Shimozato; Kenichi Yanagi; Mitsuo Kato; Tetsuyoshi Wada, all of Hiroshima; Norio Tsukiji, Osaka; Takuya Aiko, Osaka; Toshiharu Kittaka, Osaka; Yasuji Nakanishi, Osaka, all of Japan

[73] Assignees: Mitsubishi Jukogyo Kabushiki Kaisha; Nisshin Steel Co. Ltd., both of Tokyo, Japan

[21] Appl. No.: 713,743

[22] Filed: Mar. 19, 1985

[30] Foreign Application Priority Data

Mar. 19, 1984 [JP] Japan .................................. 59-51141
May 1, 1984 [JP] Japan .................................. 59-86169

[51] Int. Cl.$^4$ ............................................. C23C 13/08
[52] U.S. Cl. ..................................... 118/718; 118/719; 118/724
[58] Field of Search ...................... 118/718, 719, 724; 427/251, 255.5; 29/DIG. 44, DIG. 78

[56] References Cited

U.S. PATENT DOCUMENTS 3,278,331 10/1966 Taylor et al. .................. 427/251 X
3,989,862 11/1976 Butler et al. .................. 427/251

Primary Examiner—Richard Bueker
Attorney, Agent, or Firm—Wenderoth, Lind & Ponack

[57] ABSTRACT

A vacuum evaporation equipment for continuous vacuum evaporation of a metal onto a band or strip of product including at least one vacuum sealing station, provision of ducts that are disposed surrounding the band product and extending from the point of vapor deposition where the band product is subjected to a vacuum evaporation process an a chamber held at a reduced pressure or vacuum state to the extent that substantially no reevaporation of once deposited metal is effectively prevented from occurring. The ducts are adapted to be heated to a temperature substantially higher than the temperature of the steel band product. In addition, there is provided at least one vacuum sealing station with rolls rotatably mounted in the interior of a casing and a complementary sealing bar mounted in a complementary engagement relationship with the rolls having a close gap therebetween. A side panel is mounted self-adjustably in sliding motion in the longitudinal direction along the axes of the rolls on the opposite ends thereof, and heaters are provided to heat the rolls, sealing bar and side panel, respectively.

16 Claims, 7 Drawing Figures

VACUUM EVAPORATION COATING EQUIPMENT

BACKGROUND OF THE INVENTION

1. Field of the Invention

The present invention relates generally to an improvement in or relating to a vacuum evaporator, and more particularly to an improved vacuum evaporation equipment for the continuous evaporation of metals such as zinc under a vacuum environment onto a band or strip of steel products.

2. Description of the Prior Art

It is generally known that when evaporating a certain metal such as zinc continuously onto a band or strip of steel product, the steel product is introduced into the evaporation chamber under the vacuum environment in sequence through the vacuum block or sealing station from the atmospheric pressure of 760 Torr. It is the general practice that the extent of vacuum provided in the atmosphere of the evaporation chamber for the evaporation operation of zinc, for instance, is set to be on the order of 1 to 0.0001 Torr. After the vacuum evaporation process is finished, the steel band is then put back under the atmospheric pressure of 760 Torr. passing through the vacuum sealing station. During this process, however, it is known that the metal such as zinc evaporated upon the steel band product would possibly be caused to be reevaporated therefrom and then deposited onto the interior wall surfaces of the evaporation chamber and the vacuum sealing station held at the relatively low pressure levels while passing therethrough, which deposition would then grow to an excessive extent, after a long running operation. This would eventually be a substantial cause of reduction in the operating efficiency of the vacuum evaporation line, such as an extra shutdown of the whole production line for removing thus-deposited zinc from the evaporation chamber and the vacuum sealing station. In addition, the quantity of reevaporated zinc will have to be scrapped, which is an immediate and substantial loss of material in the normal operation.

In consideration of such circumstances as noted above, it has long been desired to prevent the reevaporation of deposition metals such as zinc in the vacuum evaporation operation and thereby improve the yield in the deposition of zinc. In this way, improved efficiency in the running operation of the vacuum evaporation line could be attained from the prevention of such reevaporation of metals to be deposited, whereby an eventual cost reduction of metal plating may be afforded, accordingly.

In the conventional vacuum evaporation equipment, the use of a vacuum block or sealing station of a construction such as typically shown in FIGS. 2 and 3 is the generally known practice. FIG. 2(a) shows a schematic cut-away view showing in cross section the conventional construction of a vacuum sealing device of a pinch roll type, and FIG. 2(b) is a cross-sectional view taken along the line A—A in FIG. 2(a), in which there is shown a pair of upper and lower rolls 01, 01 disposed rotatably in a casing 06, having a web of steel 05 pinched in a sandwiched relationship therebetween. It is arranged that the opposite end faces of these paired rolls 01, 01 are placed facing the side wall surfaces of the casing 06 having close gaps 02 therewith, in such a manner that the gaps 02 may be made as small as possible, while allowing a gas to pass therethrough, so that there may be obtained a substantial grade of vacuum within the casing 06. Also, it is arranged such that the casing 06 may be in communication with a vacuum pump, not shown, through an exhaust duct.

With such a general arrangement, it is noted that when the paired rolls 01, 01 and the side walls of the casing 06 expand due to heat involved during the operation, the close gaps 02 are caused to be greater, thus making it necessary to have an operating capacity of the vacuum pump for the air exhaustion increased accordingly. In order to meet this situation, therefore, it is arranged according to the conventional measure of practice that the rolls 01, 01 and the casing 06 are prevented from being expanded with heat by way of the water cooling system so that the close gaps 02 may be held to be constant.

However, taking for instance the case that the steel band 05 is vacuum evaporated with a certain metal such as zinc, this zinc once deposited on the steel band 05 is caused to be reevaporated therefrom in the form of zinc vapor, part of which vapor would come to deposit upon the surfaces of the paired rolls 01 or the like held at a relatively low temperature, and also would deposit in the small gap provided between these rolls 01 and the sealing bars 03, which would then become an obstacle to the normal rotating motion of the rolls 01. Also, there is a possibility that the thus-deposited zinc would fall from the gap and drop onto the surface of the steel band 05 as it passes therethrough, which would tend to be a lump of metal deposited on the steel band surface. This lump would be translated over to the roll surfaces of the vacuum sealing station, thus built up thereupon, which would very possibly give rise to the risk of damages to be rendered upon the surfaces of the steel band, as it passes therethrough during the operation.

FIG. 3(a) is a schematic side elevational view showing, partly cut away, a vacuum sealing station of a bridle type, and FIG. 3(b) is a longitudinal cross-sectional view taken along the line B—B in FIG. 3(a), in which it is seen that the steel band 05 is threaded in the wrapped-around fashion across a pair of upper and lower rolls 01, 01, and that there are a pair of covers 04 of arcuate shape disposed in complementary relationship with the running path of the steel band on the rolls 01, 01. There may also be observed the similar problem of deposition of metals in this type sealing station to the case as noted above.

The present invention is essentially directed to the provision of an effective and proper resolution to such inconveniences and difficulties in practice as outlined above and experienced in the adoption of the conventional vacuum evaporation process left unattended with any proper countermeasures therefor, which can afford an extensive adaptation in use with the general vacuum evaporation process, accordingly.

SUMMARY OF THE INVENTION

It is therefore a primary object of the present invention to provide an improvement in or relating to the vacuum evaporation process, which is essentially adapted to control the possibility of reevaporation of once deposited metals such as zinc upon steel products, thereby improving the eventual yield of such metals to be deposited in the vacuum evaporation process.

It is another object of the present invention to provide an improvement relating to the vacuum evaporation equipment, which is essentially adapted to contribute to the improvement in operating efficiency of the vacuum evaporation process by virtue of reduction in the possibility of frequent shut-downs of the evaporation line by undesired deposition of metals.

It is still another object of the present invention to provide an improvement relating to the vacuum evaporation equipment, which is essentially directed to the adaptation of a vacuum pump of small capacity made available with an efficient maintenance of vacuum throughout the vacuum evaporation process.

It is a still further object of the present invention to provide an improvement relating to the vacuum evaporation equipment, which is essentially directed to the prevention of undesired deposition of metal vapor which is reevaporated from the deposited product surface onto the operating rolls and the like, and into the gap between the rolls and the related cover members, thus preventing adverse effects of such deposition to the rotating motion of the rolls and to the quality of finished products.

The above noted objects of the invention can be attained efficiently from the improvement relating to a vacuum evaporation equipment for continuous vacuum evaporation of a metal onto a band or strip of product including at least one vacuum sealing station according to one aspect of the present invention, which comprises, as summarized in brief, duct means that are disposed surrounding the band product and extending from the point of vacuum deposition where the band product is subjected to vacuum evaporation process to a chamber held at a reduced pressure or vacuum state to an extent that substantially no reevaporation of once deposited metal is effectively prevented from occurring, and that are adapted to be heated to a point substantially higher than the temperature of the steel band product.

These objects of the present invention can also be attained from the improvement relating to vacuum evaporation equipment for continuous vacuum evaporation of a metal onto a band or strip of product including at least one vacuum sealing station, roll means mounted rotatably in the interior of a casing and complementary cover means mounted in a complementary engagement relationship with the roll means at a close gap therebetween, according to one aspect of the present invention, which comprises, as summarized in brief, side panel means mounted self-adjustably in sliding motion in the longitudinal direction along the axes of the roll means on the opposite ends thereof, and heater means mounted adjacently and operatively to heat the roll means and complementary cover means.

The principle, nature and details of the present invention will, as well as advantages thereof, become more apparent from the following detailed description by way of a preferred embodiment of the invention, when read in conjunction with the accompanying drawings, in which like parts are designated at like reference numerals.

DETAILED DESCRIPTION OF THE PREFERRED EMBODIMENT

The present invention will now be described in detail by way of example of a preferred embodiment thereof in conjunction with the accompanying drawings, as follows.

Figure 1:
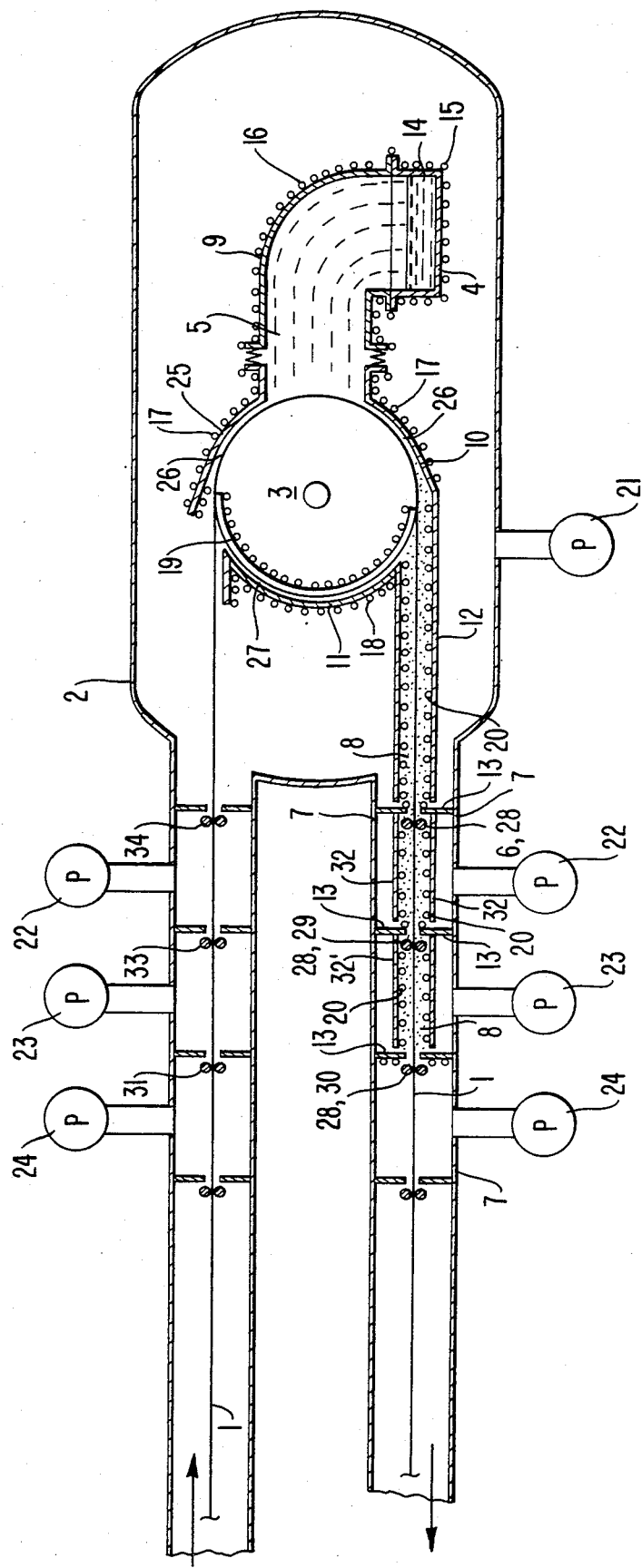
FIG. 1 is a schematic general view showing, in longitudinal cross-section, the construction of a vacuum evaporation equipment by way of a preferred embodiment of the present invention.
Figure 2A:
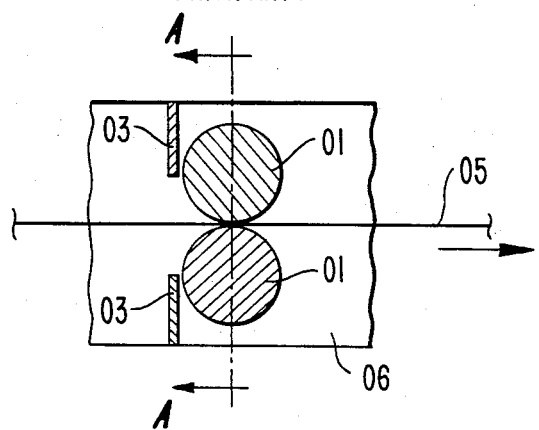
FIG. 2(a) is a schematic side elevational view showing, in cross-section, the general construction of a vacuum sealing station of pinch-roll type.
Figure 2B:
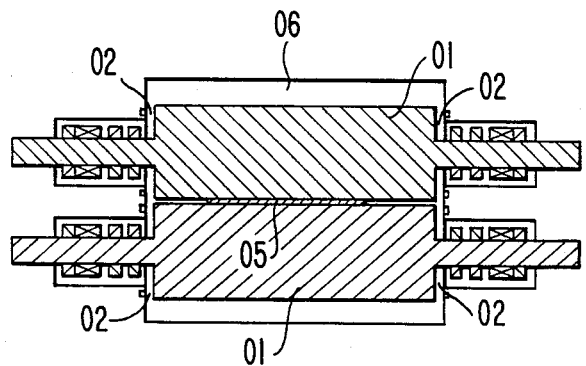
FIG. 2(b) is a schematic cross-sectional view taken along the line A—A in FIG. 2(b)

Now, referring to FIG. 1, there is shown, by way of a preferred embodiment of the present invention, the general construction of a vacuum evaporation equipment. In FIG. 1, it is seen that a strip or band of steel 1 is introduced into a vacuum vessel 2 held at a relatively low pressure. The strip or band of steel 1 is passed in sequence through vacuum block or sealing stations 31, 33 and 34 disposed in serial fashion on the inlet part of the vacuum evaporation process after which the steel band 1 is then deposited with a vapor of metal, for example, zinc which is evaporated from an evaporation vessel 4, while guided along by way of a roll 3. Thereafter, the steel band 1 is passed in sequence through a series of vacuum sealing stations 6, 29, and 30, each of which is at a higher pressure.

It is known that zinc, now in the state of a solid deposited upon the surface of the steel band 1, is generally likely to be reevaporated in an environment of a relatively low pressure or vacuum. This is the phenomenon called reevaporation of metals in the general vacuum evaporation process. This specific trend of reevaporation would generally decrease as the pressure of an atmosphere grows higher, and it is actually questionable in the engineering of such vacuum evaporation process with the extent of vacuum ranging from 10 to 20 Torr. It is generally noted that there may be observed a greater extent of reevaporation especially in the part of the evaporation line that is held at a relatively low pressure.

It is commonly known to those skilled in the art that solid zinc will continue to reevaporate from the deposited surface of the steel band 1 until it reaches its pressure of saturated vapor prevailing at the current temperature of solid zinc. In this conncection, therefore, when the steel band 1 deposited with zinc passes through devices such as, for example, a series of vacuum sealing stations 6, 29, 30 on the outlet side of the vacuum vessel 2 with a middle duct 7 connecting each of these stations, all of which are held at the normal temperature, the then reevaporated vapor of zinc 8 will be deposited onto the interior of each of such devices. More specifically, this reevaporation may continuously occur from the surface of solid zinc deposited on the steel band 1 onto such devices as noted above, upon which such deposition is observed eventually. Thus-deposited solid zinc should be removed at regular intervals, which would naturally result in a decrease in the productivity of the vacuum evaporation line, accordingly.

The vapor of zinc 5 is deposited upon the steel band 1 in a process wherein the vapor is introduced toward the roll 3 through a channel 9, which completes the zinc deposition step, after which the steel band 1 is carried away from the circumference of the roll 3. There is seen provided an inner duct 12, which is heated by way of a heater 20, extending in the tangential manner from a set of arcuate cover members 10, 11 on the outlet side of the roll 3, and connected with a series of sealing bars 13 in the vacuum sealing station 6. In this connection, it is specifically arranged that the steel band 1 which was deposited with solid zinc is surrounded thoroughly by the extension of the heated inner duct 12 so that the reevaporated vapor of zinc may effectively be prevented from depositing upon the inner duct 12 because of its heat, thus resulting in a vapor of reevaporated zinc 8 drifting around in the interior of the inner duct 12, which would not deposit any longer upon the steel band 1 as the current component of the vapor of zinc reaches its pressure of saturated vapor $P_1$ at the current temperature of reevaporation $T_1$ of the solid zinc deposited on the surface of the steel band 1. Upon reaching the pressure of saturated vapor $P_1$, even if a large extension of the steel band 1 finished with vacuum evaporation will continue to pass through the inner duct 12, as the reevaporation of solid zinc is effectively held from occurring, a substantial improvement in the yield of zinc during the evaporation operation may well be attained, accordingly. In addition, by virtue of the effective control in restraint of the vapor of reevaporated zinc 8, there may be attained the substantial improvement in the operability of the entire evaporation line with less frequent shut-downs, thus resulting in an increase in the productivity of the entire line, after all.

Referring more specifically to the construction shown in FIG. 1 by way of the preferred embodiment of the invention, the evaporation vessel 4 is heated to the melting point of zinc by way of a heater 15. Molten zinc 14 heated up to the temperature from 430° to 580° C. is then put to purge the atmospheric gas, for example, nitrogen therefrom by using a vacuum pump 21, and when the atmosphere in the vacuum vessel reaches the pressure level from 1 to 0.0001 Torr., it will then start evaporation. Thus evaporated vapor of zinc 5 guided along with the channel 9, which is heated by a heater 16, is deposited continuously onto the surface of the steel band 1 wrapped around the roll 3. There is provided a heater 19 extending along the inner circumference of the roll 3. With this arrangement, the outer surface temperatures of the roll 3 and of the arcuate cover members on the opposite ends thereof are heated to a point higher than the reevaporation temperature of the vapor of zinc 5 at the current vapor pressure thereof, for example, 580° C. at the pressure level of 1 Torr., or 230° C. at the level of 0.0001 Torr.

There are provided an arc-shaped cover member 25 which is heated by a heater 17 on the entrance side of the steel band 1 extending around the circumference of the roll 3 and also the arc-shaped cover member 10 which is heated by the heater 17 on the outlet side of the roll 3 in such a manner that a substantial volume of zinc vapor 5 may be prevented from flowing out into the vacuum vessel 2 while being guided along the channel 9, and that the outer surfaces of these cover members 25 and 10 may be heated to a temperature level higher than the corresponding reevaporation temperature of the vapor of zinc 5 at the current vapor pressure thereof, for example, to the level of from 230° to 580° C. under the vapor pressure of from 1 to 0.0001 Torr. With such an arrangement, an advantage is obtained in that there is no deposition of reevaporated zinc vapor onto the surfaces of the roll 3 as well as the arc-shaped cover members 25 and 10, respectively.

The arrangement also provides a gap 26 between the roll 3 and the arc-shaped cover members 25 and 10 which is as small as possible but such that the steel band 1 does not contact with these arc-shaped cover members 25, 10. An extension of the gap 26 is provided around the outer circumferential surface of the roll 3 which should be as long as possible and permitted by the dimensions of the equipment so that the vapor of zinc 5 may effectively be held from escaping into the areas of the vacuum vessel 2 and the inner duct 12 owing to a possible loss of pressure during the passage through the extension of gap 26.

Also, the similar arcuate cover member 11 is provided with a heater 18 on the side opposite to the side where the steel band 1 passes around the circumference of the roll 3 in such a manner that it may be heated by that heater 18 to a temperature higher than the reevaporation temperature of the vapor of zinc 5 so that the zinc vapor may be prevented from being deposited upon the inner surface of that cover member 11, accordingly. It is also notable that a gap 27 defined between this cover member 11 and the roll 3 is made as small as possible to such an extent that there is no contact between the roll 3 and the cover member 11 when installed together, so that the reevaporated vapor of zinc 8 existing in the inner duct 12 may effectively be prevented from escaping out into the vacuum vessel 2 owing to a possible pressure loss generated in the extension of gap 27, accordingly.

Also, it is arranged such that the inner duct 12 is operatively connected at its one end to these cover members 10 and 11, while being connected at the opposite end thereof with an expansion allowance to the sealing bar 13 of the vacuum sealing station 6, and also designed to be heated in its longitudinal extension by using a heater 20.

It is noted that the vacuum sealing stations 6 and 34 are comprised of a vacuum pump 22, the vacuum sealing stations 29 and 33 are comprised of a vacuum pump 23, and that the vacuum sealing stations 30 and 31 are comprised of a vacuum pump 24, respectively, each of which is evacuated to a vacuum state. The vacuum sealing stations 24, 23 and 22 are designed to give a stepwise reduction of pressures while passing the steel band 1 in sequence therethrough from the atmospheric pressure of 760 Torr., down to the level of 1 to 0.0001 Torr. in the interior of the vacuum vessel 2 where the steel band 1 is subjected to the vacuum evaporation operation. As the steel band 1 passes out of the vacuum evaporation process through the stages of vacuum sealing stations 6, 29 and 30 there is a stepwise increasing level of pressures up to the atmospheric pressure of 760 Torr., thus providing a vacuum state throughout the vacuum evaporation procedures in the processing line.

There are povided heaters (not shown) in the interior of pairs of sealing rolls 28 at each of the vacuum sealing stations 6, 29, 30 for the purpose of heating the outer circumferential surfaces of these rolls to a point equal to or higher than the reevaporation temperature of solid zinc which was deposited upon the steel band 1 so that the vapor of reevaporated zinc 8 is effectively prevented from being deposited upon these rolls. Also provided is a heater, not shown, in each of the sealing bars 13 for heating them to the same temperature level as that of the sealing rolls 28, so that the vapor of reevaporated zinc 8 is prevented from depositing thereupon, accordingly.

Now, referring to the operation of the present vacuum evaporation equipment according to the present invention, it is noted that the steel band 1, after it is finished with the vacuum evaporation procedure, is fed from the roll 3 through the inner duct 12, which is heated with the heater 20, with the possibility that a reevaporation of solid zinc may occur from the deposited surface of the steel band 1. A mixture of nitrogen ($N_2$) and a vapor of reevaporated zinc 8 is uniformly dispersed in the interior of the inner duct 12. Under such a condition, reevaporation of solid zinc from the surface of the steel band 1 may continue until the current partial pressure of zinc vapor from the reevaporation of zinc 8 reaches the pressure of saturated vapor $P_1$ of zinc at the reevaporation temperature $T_1$ of solid zinc deposited on the surface of the steel band 1.

In this case, however, since the temperature of the surface of the inner duct 12 which the steel band 1 faces while passing therethrough is heated by the heater 20 to a point equal to or higher than the current reevaporation temperature of solid zinc existing on the steel band 1, it is notable that there is no deposition of the vapor of reevaporated zinc 8 onto the inner wall surface of the inner duct 12, at all.

In this manner, an advantageous result is achieved wherein deposition of zinc is not observed upon the surfaces of the steel band 1 while passing through the vacuum vessel and through the sequence of vacuum sealing stations 6, 29 and 30, thus making it feasible in practice to perform the continued vacuum evaporation process free from deposition of zinc throughout the series of vacuum sealing stations 6, 29 and 30, thus providing a flawless product of evaporation, accordingly.

On the other hand, after the partial pressure of the vapor of reevaporated zinc 8 reaches the current pressure of saturated zinc vapor $P_1$ prevailing at the reevaporation temperature $T_1$ of solid zinc existing on the surface of the steel band 1 within the inner duct 12, there will not occur any further reevaporation of zinc, thus contributing to a substantial reduction in the waste zinc vapor, which would otherwise be lost in the reevaporation of solid zinc deposited on the steel band 1.

There are also provided inner ducts 32 and 32' with an appropriate expansion allowance between the vacuum sealing stations 6 and 29 and between the vacuum sealing stations 29 and 30, which inner ducts are heated by way of the heater 20 for the prevention of reevaporation of solid zinc during the operation of the equipment.

It is known that the extent of reduced pressure or degree of vacuum required to control zinc reevaporation in the process is up to approx. 20 Torr. or so, and in this connection, it is essential to extend is the inner duct 12 from the vacuum vessel 2 to the vacuum sealing stations under the reduced pressure of approx. 20 Torr., which inner duct is heated by way of a heating device incorporated therein. The inner duct per se is formed from a sheet of stainless steel or of ordinary steel, and this duct has its outer surface insulated by using heat insulating material (not shown) so that it may be heated with a small power consumption.

When the total pressure of nitrogen gas ($N_2$) and the vapor of reevaporated zinc 8 existing in the inside of the inner duct 12 is not equal to the pressure level of the atmosphere in the vacuum vessel 2, there may occur evaporation of molten zinc 14 in the evaporation vessel 4, which would then block the vacuum evaporation onto the steel band 1. In consideration of such a condition, small openings (not shown) are provided in the inner ducts 12, 32 and 32', respectively, which are essentially directed to the provision of an equalization of the total pressure of $N_2$ gas and the vapor of reevaporated zinc 8 in the inner ducts 12, 32, 32' and of the pressure of atmosphere in each of their vacuum chambers.

In this above described construction, it is to be noted that there is only a small negligible quantity of vapor of reevaporated zinc 8 dispersing outwardly from such openings provided in the inner ducts.

Figure 5:
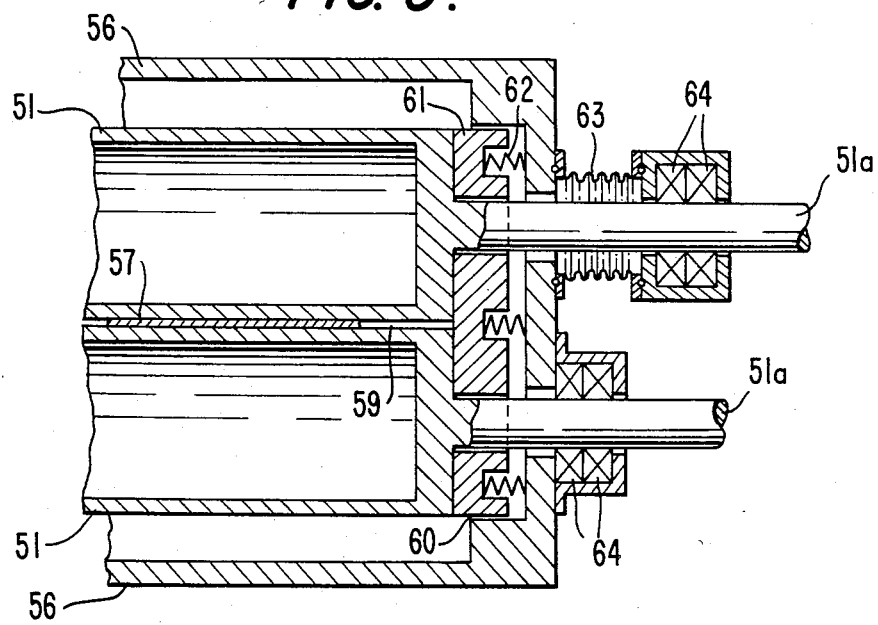
FIG. 5 is a fragmentary cross-sectional view taken along the line C—C in FIG. 4.
Figure 3A:
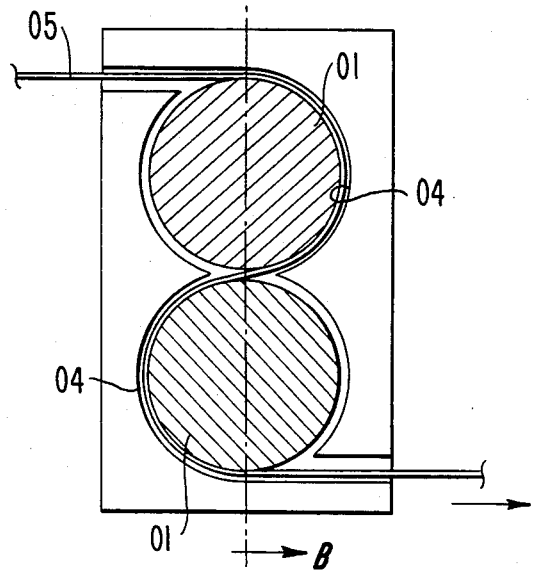
FIG. 3(a) is a schematic side elevational view showing, in cross-section, the construction of a vacuum sealing station of bridle-roll type.
Figure 3B:
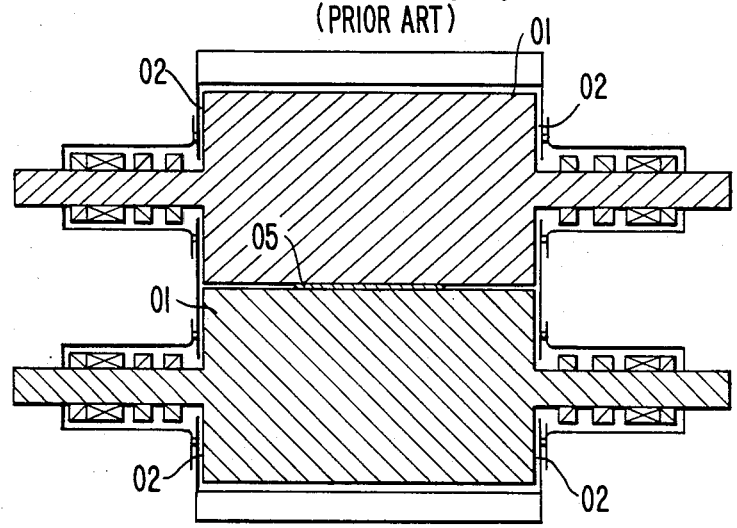
FIG. 3(b) is a schematic cross-sectional view taken along the line B—B in FIG. 3(a)
Figure 4:
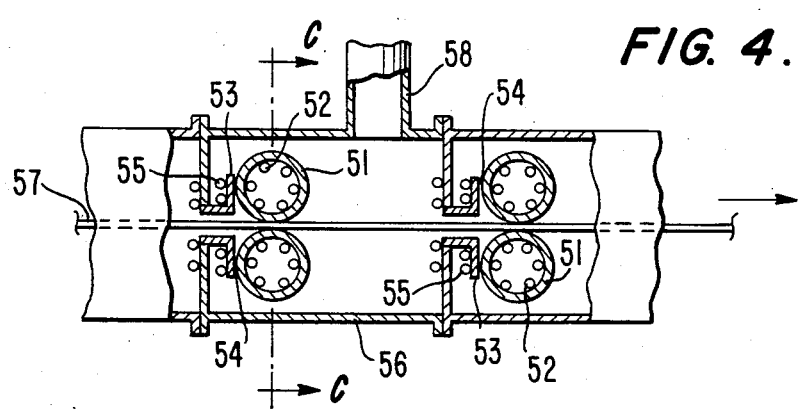
FIG. 4 is a fragmentary schematic view showing, partly cut-away, the construction of a vacuum sealing device according to the present invention.

Next, referring to FIG. 4, there is shown a schematic side elevational view showing, partly cut-away, the general construction of the vacuum sealing station according to the present invention, while FIG. 5 is a fragmentary cross-sectional view taken along the line C—C in FIG. 4.

As seen in these figures, the vacuum sealing stations are of a pinchroll type, and in this construction, there are provided pairs of upper and lower rolls 51, only two pairs of which are shown in FIG. 4, mounted rotatably for carrying a band of steel 57 in the sandwiched relationship therebetween in the interior of a casing 56. It is also shown that each of such rolls 51 is designed to be hollow for incorporating a heating unit 52 which is used to heat a roll 51. In FIG. 5, there is shown a rotating shaft 51a extending from the opposite ends of each roll 51 outwardly through the side walls of the casing 56, and that there is provided a shaft seal 64 on the outer circumference of each of the rotating shafts 51a in the sliding contact fashion. There is also shown a dust boot of a bellows type designated by the reference numeral 63 in FIG. 5.

Also, as shown in FIG. 5, there are provided side panels 61 formed from carbon or carbon fiber lining having a high heat-seizure resisting property on the opposite side ends of the roll 51 in such a manner that they are held resiliently in position against the roll side ends by aid of springs 62. In connection with this construction, there are formed close gaps 59, 60 between the pair of upper and lower rolls 51, 51, and between the outer circumference of the side panel 61 and the inner circumference of the casing 56, respectively.

On the other hand, there is provided a sealing bar 53 separated by a close gap 54 from each of the rolls 51 in such a manner that it can be shifted slidably along in the direction of forward travelling motion of the steel band 57 (shown by an arrow in FIG. 4), so that the gap 54 may be adjusted by shifting the location of the sealing bar 53 in the longitudinal direction, as desired. There is also shown provided a heating unit 55 in the vicinity of the sealing bar 53 for heating the same. It is to be noted that the hollow space in the interior of the casing 56 is in fluid communication with a vacuum pump, not shown, by way of an exhaust duct 58.

With such a construction, it is noted that when the sealing rolls 51 and the sealing bars 53 are heated by using the heating units 52, 55 to a temperature higher than the reevaporation temperature of a metal to be vacuum evaporated onto the steel band 57, an undesired deposition of the metal to be evaporated, otherwise observed at the sealing rolls 51 and the sealing bars 53, as well as at the gap 54, may efficiently be prevented from occurring. The result is an ensured smooth rotating motion of the rolls 51, thus eliminating the risks of damages or flaws to the finished surface of the steel band 57, and thus ensuring the eventual excellent quality of the products.

In addition, by virtue of the employment of the side panels 61 mounted constantly with resiliency against the side walls of the rolls 51, it is now possible in practice to have an optimal gap that may constantly be maintained to a minimum between the sealing rolls 51 and the casing 56, irrespective of the current extent of heat expansion of these members involved, and with such an advantageous effect, it is practicably possible to apply a vacuum pump of a smallest possible capacity for the same scale of a production line, thus contributing to a substantial curtailment in the initial investment and the subsequent running exhaust operation cost of a vacuum evaporation plant, accordingly.

The present invention was fully explained hereinbefore, and a further review will now be given by way of a typical example of the invention, as follows.

EXAMPLE

There was conducted a series of evaporation works on the equipment shown in FIG. 1 under the following conditions.

Specification of Steel Band: 0.6 mm thick × 300 mm wide normal steel sheet

Velocity of Steel Sheet: 15 m/min.

Temp. of Steel Sheet: 250° C., before vacuum evaporation operation

Vacuum Operationg Conditions:

Pressure of Vaccum Vessel: 0.07 Torr.

Pressure of Vaccum Seal 6: 1.00 Torr.

Pressure of Vaccum Seal 29: 10.00 Torr.

Pressure of Vaccum Seal 30: 70.00 Torr.

Temp. of Inner Walls of Inner Ducts 12, 32, 32': 300° C.

Temp. of Molten Zinc 14: 480° C.

Temp. of Inner Walls of Arc-shaped Cover Members 10, 11, and 25: 480° C.

Temp. of Outer Surface of Roll 3: 480° C.

Surface Temp. of Seal Roll 28 and Sealing Bar 13: 300° C.

Thickness of Deposited Melal: 40 gr/m$^2$

As the result of experiments of vacuum evaporation operation under such conditions as outlined above, no deposition of reevaporated zinc was observed at all on the inner wall surfaces of the inner ducts 12, 32 and 32'. The amount of zinc vapor observed from the orifices provided in the inner ducts 12, 32 and 32' was found to be so small as to be negligible. These results are evidence that the reevaporation of solid zinc from the deposited surface of the product was suppressed satisfactorily from occurring by having the inner ducts 12, 32, 32' heated to control their temperatures, accordingly.

In practice of the present invention there was observed no deposition of zinc upon either the surfaces of the sealing rolls or the sealing bars in the evaporation test plant. Also, it was confirmed that these sealing stations exhibited substantially higher sealing performance than in the case wherein the rolls are cooled off with cooling water.

EFFECT AND FUNCTION OF THE INVENTION

Now, according to such a unique construction of the vacuum evaporation equipment as adaptable to the general vacuum evaporation line as typically shown by way of the preferred embodiment of the present invention, a substantial advantage achieved by the disclosed embodiments of the invention is that the undesired reevaporation of solid zinc deposited on the product surface may efficiently be prevented from occurring, the quantity of reevaporated zinc may be held to a minimum, and the undesired deposition of reevaporated zinc onto the vacuum vessel, the vaccum sealing stations, or the like may well be prevented as far as possible, by virtue of the provision of controlled heating of the inner ducts according to the invention, thus contributing to the substantial improvement in the operating efficiency, and hence in the productivity of the entire production line.

Also, it is the advantageous effect afforded by the present invention that the undesired deposition of the metal to be evaporated onto the rolls and the gaps between the rolls and relevant cover members thereto may effectively be prevented from occurring, by virtue of the provision of the side panels shiftable longitudinally along the axes of the rolls and mounted resiliently on the opposite sides of the rolls, and which are heated to a temperature higher than the reevaporation temperature of the metal to be evaporated, thus ensuring the continued normal smooth rotating motion of the rolls, eliminating the adverse effects upon the products, and thus providing a high degree of vacuum in the components involved in the vacuum evaporation equipment, which would eventually enable a vacuum pump small as possible having a capacity as small as possible to be adapted, accordingly.

It is now clear that the objects as set forth hereinbefore among those made apparent from the preceding description are efficiently attained, and while the present invention has been explained by way of the preferred embodiments thereof, it is to be understood that many changes and modifications may be made in the foregoing teaching without departing from the spirit and scope of the invention, and it is intended that all matter contained in the foregoing description or shown in the accompanying drawings shall be interpreted as illustrative and not in any more limiting sense.

It is also to be understood that the appended claims are intended to cover all of such generic and specific features particular to the invention as disclosed herein and all statements relating to the scope of the invention, which as a matter of language might be said to fall thereunder.

What is claimed is:

1. A vacuum evaporation equipment for continuous vacuum evaporation of a metal onto a band or strip of product comprising:

means for continuous vacuum evaporation of a metal onto a strip or band of product;

at least one vacuum sealing station, said sealing station including a casing;

roll means rotatably mounted in the interior of said casing, said roll means including rolls which extend in a longitudinal direction;

cover means mounted in a complementary engagement relationship with said roll means, said cover means forming a small gap with said roll means, said cover means including side panel means mounted on opposite ends of said rolls, said side panel means being slidable and self-adjustable along said longitudinal direction of said rolls for forming a small gap between said ends of said rolls and said side panel means; and heater means mounted adjacent said roll means and said cover means for preventing deposition of metal onto said roll means and said cover means.

2. The vacuum evaporation equipment for continuous vacuum evaporation of a metal onto a band or strip of product as claimed in claim 1, wherein said band of product is a band steel.

3. The vacuum evaporation equipment for continuous vacuum evaporation of a metal onto a band or strip of product as claimed in claim 1, wherein said metal to be vacuum evaporated is zinc.

4. The vacuum evaporation equipment for continuous vacuum evaporation of a metal onto a band or strip of product as claimed in claim 1, wherein said vacuum sealing station is of a pinch-roll type.

5. The vacuum evaporation equipment for continuous vacuum evaporation of a metal onto a band or strip of product as claimed in claim 1, wherein said vacuum sealing station is of a bridle-roll type.

6. A vacuum evaporation equipment for continuous vacuum evaporation of a metal onto a band or strip of product comprising:
 means for continuous vacuum evaporation of a metal onto a strip or band of product including a chamber held at a reduced pressure or vacuum state;
 at least one vacuum sealing station, said vacuum sealing station including a casing;
 duct means extending between said chamber and said at least one vacuum sealing station, said duct means surrounding said band product and extending from a point of vapor deposition of a metal onto said strip or band product in said chamber;
 heater means for heating said duct means for preventing substantially any reevaporation of once deposited metal on said strip or band product from occurring while said strip or band product is in said duct means;
 roll means rotatably mounted in the interior of said casing, said roll means including rolls which extend in a longitudinal direction;
 cover means mounted in a complementary engagement relationship with said roll means, said cover means forming a small gap with said roll means, said cover means including side panels means mounted on opposite ends of said rolls, said side panel means being slidable and self-adjustable along said longitudinal direction of said rolls for forming a small gap between said ends of said rolls and said side panel means; and
 heater means mounted adjacent said roll means and said cover means for preventing deposition of metal onto said roll means and said cover means.

7. The vacuum evaporation equipment for continuous vacuum evaporation of a metal onto a band or strip of product as claimed in claim 6, wherein said band of product is a band steel.

8. The vacuum evaporation equipment for continuous vacuum evaporation of a metal onto a band or strip of product as claimed in claim 6, wherein said metal to be vacuum evaporated is zinc.

9. The vacuum evaporation equipment for continuous vacuum evaporation of a metal onto a band or strip of product as claimed in claim 6, wherein said vacuum sealing station is of a pinch-roll type.

10. The vacuum evaporation equipment for continuous vacuum evaporation of a metal onto a band or strip of product as claimed in claim 6, wherein said vacuum sealing station is of a bridle-roll type.

11. A vacuum evaporation equipment for continuous vacuum evaporation of a metal onto a band or strip of product comprising:
 means for continuous vacuum evaporation of a metal onto a strip or band of product including a chamber held at a reduced pressure or vacuum state;
 at least one vacuum sealing station;
 means between said chamber and said at least one vacuum sealing station for maintaining a saturated metal vapor pressure around a band or strip coated with metal in said chamber, said means including a duct and heater means;
 said duct extending between said chamber and said at least one vacuum sealing station, said duct surrounding said band product and extending from a point of vapor deposition of a metal onto said strip or band product in said chamber to said at least one sealing station; and
 said heater means for heating said duct to maintain a saturated vapor pressure therein for preventing substantially any re-evaporation of once deposited metal on said strip or band product from occurring while said strip or band product is in said duct.

12. The vacuum evaporation equipment for continuous vacuum evaporation of a metal onto a band or strip of product as claimed in claim 11, wherein said band of product is a band steel.

13. The vacuum evaporation equipment for continuous vacuum evaporation of a metal onto a band or strip of product as claimed in claim 11, wherein said metal to be vacuum evaporated is zinc.

14. The vacuum evaporation equipment for continuous vacuum evaporation of a metal onto a band or strip of product as claimed in claim 11, wherein said vacuum sealing station is of a pinch-roll type.

15. The vacuum evaporation equipment for continuous vacuum evaporation of a metal onto a band or strip of product as claimed in claim 11, wherein said vacuum sealing station is of a bridle-roll type.

16. The vacuum evaporation equipment for continuous vacuum evaporation of a metal onto a band or strip of product as claimed in claim 13, wherein said duct, said heater means and said chamber held at a reduced pressure are all disposed within a vacuum vessel.

* * * * *